United States Patent
Nix (10) Patent No.: US 9,958,484 B2
(45) Date of Patent: May 1, 2018

(54) APPARATUS AND METHOD FOR MEASURING LOAD CURRENT BY APPLYING COMPENSATED GAIN TO VOLTAGE DERIVED FROM DRAIN-TO-SOURCE VOLTAGE OF POWER GATING DEVICE

(71) Applicant: QUALCOMM Incorporated, San Diego, CA (US)

(72) Inventor: Michael Arn Nix, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 253 days.

(21) Appl. No.: 14/794,496

(22) Filed: Jul. 8, 2015

(65) Prior Publication Data

US 2017/0010312 A1 Jan. 12, 2017

(51) Int. Cl.
*G01R 31/02* (2006.01)
*G01R 19/32* (2006.01)
*G01R 19/00* (2006.01)

(52) U.S. Cl.
CPC ......... *G01R 19/32* (2013.01); *G01R 19/0092* (2013.01)

(58) Field of Classification Search
CPC G01R 31/26; G01R 31/2642; G01R 31/2648; G01R 31/2831; G01R 31/31702
See application file for complete search history.

(56) References Cited

U.S. PATENT DOCUMENTS

| 3,584,232 | A | * | 6/1971 | Wallace, Jr. ............. G06G 7/24 327/352 |
| 7,202,711 | B2 | | 4/2007 | Gose et al. |
| 7,557,599 | B2 | | 7/2009 | Graf |
| 8,098,058 | B2 | | 1/2012 | Theil et al. |
| 8,193,855 | B2 | | 6/2012 | Kawasaki |
| 9,024,678 | B2 | | 5/2015 | Vacca Cavalotto et al. |
| 9,263,877 | B1 | * | 2/2016 | Kellogg .................... G06F 1/18 |
| 2004/0155635 | A1 | | 8/2004 | Inaba |

(Continued)

FOREIGN PATENT DOCUMENTS

WO    WO-2014072383 A1    5/2014

OTHER PUBLICATIONS

International Search Report and Written Opinion—PCT/US2016/036512—ISA/EPO—dated Aug. 26, 2016.

*Primary Examiner* — Tung X Nguyen
(74) *Attorney, Agent, or Firm* — Loza & Loza, LLP/Qualcomm (57) ABSTRACT

Apparatus and method are disclosed for measuring a load current supplied to one or more integrated circuit cores. The apparatus includes a power gating field effect transistor (FET) comprising a gate, a source, and a drain, wherein the source is coupled to a voltage rail, wherein the drain is coupled to a load, and wherein the gate is configured to receive a gating voltage to selectively turn on the power gating FET to allow a load current to flow between the voltage rail and the load; and a differential amplifier configured to generate a current-related voltage related to the load current by applying a gain to an input voltage based on a drain-to-source voltage of the power gating FET, wherein the gain varies inversely with the input voltage in response to variation in temperature or gate-to-source voltage of the power gating FET.

10 Claims, 6 Drawing Sheets

(56) References Cited

U.S. PATENT DOCUMENTS

2009/0267589 A1\* 10/2009 Zhang ................ G01R 19/0092
  324/123 R
2012/0169377 A1   7/2012 Thiele et al.
2012/0293017 A1   11/2012 Lidsky et al.
2014/0266105 A1\* 9/2014 Li ........................... G05F 1/565
  323/280

\* cited by examiner

APPARATUS AND METHOD FOR MEASURING LOAD CURRENT BY APPLYING COMPENSATED GAIN TO VOLTAGE DERIVED FROM DRAIN-TO-SOURCE VOLTAGE OF POWER GATING DEVICE

BACKGROUND

Field

Aspects of the present disclosure relate generally to measuring load current, and more particularly, to an apparatus and method for measuring load current by applying a compensated gain to a voltage derived from a drain-to-source voltage of one or more power gating devices.

Background

Current supplied to one or more cores of an integrated circuit (IC) is typically gated through a power gating circuit. A power gating circuit typically comprises one or more power gating devices (e.g., PMOS devices) (also referred to as block head switches (BHS)) connected in parallel between a voltage rail (Vdd) and one or more cores of the IC. To selectively supply power to the one or more cores, the gate voltage of the PMOS device may be set to approximately zero (0) Volts to turn on the device and allow current to flow to the one or more cores, and the gate voltage may be set to approximately Vdd to turn off the device, and prevent current from flowing to the one or more cores.

In many applications, the current supplied to the one or more cores (the "load current") may be measured and controlled so that the IC may be operated safely and/or for other purposes. One way of measuring the load current is to sense the drain-to-source voltage (Vds) across the one or more parallel PMOS devices. Assuming that the drain-to-source resistance (Rds) of the one or more PMOS devices is constant, the sensing of Vds provides an indication of the load current.

However, the Rds of the one or more PMOS devices varies with temperature and with the gate-to-source voltage (Vgs). The Vgs may vary due to intentional variation of Vdd for different applications. Because Rds varies with temperature and Vgs, simply sensing Vds of the one or more PMOS devices to determine the load current produces errors in the current measurement.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus for measuring a load current. The apparatus comprises a power gating field effect transistor (FET) including a gate, a source, and a drain, wherein the source is coupled to a voltage rail, wherein the drain is coupled to a load, and the gate is configured to receive a gating voltage to selectively turn on the power gating FET to allow the load current to flow between the voltage rail and the load by way of the power gating FET. The apparatus further comprises a differential amplifier configured to generate a current-related voltage related to the load current by applying a gain to an input voltage based on a drain-to-source voltage of the power gating FET, wherein the gain varies inversely with the input voltage in response to variation in temperature or gate-to-source voltage of the power gating FET.

Another aspect of the disclosure relates to a method of generating a current-related voltage related to a load current supplied to a load. The method comprises generating an input voltage related to a drain-to-source voltage of a power gating field effect transistor (FET) coupled between a voltage rail and the load. The method further comprises amplifying the input voltage with a gain to generate the current-related voltage, wherein the gain varies inversely with the input voltage in response to variation in temperature or gate-to-source voltage of the power gating FET.

Another aspect of the disclosure relates to an apparatus for measuring a load current. The apparatus comprises means for generating an input voltage related to a drain-to-source voltage of a power gating field effect transistor (FET) coupled between a voltage rail and a load. The apparatus further comprises means for amplifying the input voltage with a gain to generate a current-related voltage, wherein the gain varies inversely with the input voltage in response to variation in temperature or gate-to-source voltage of the power gating FET.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
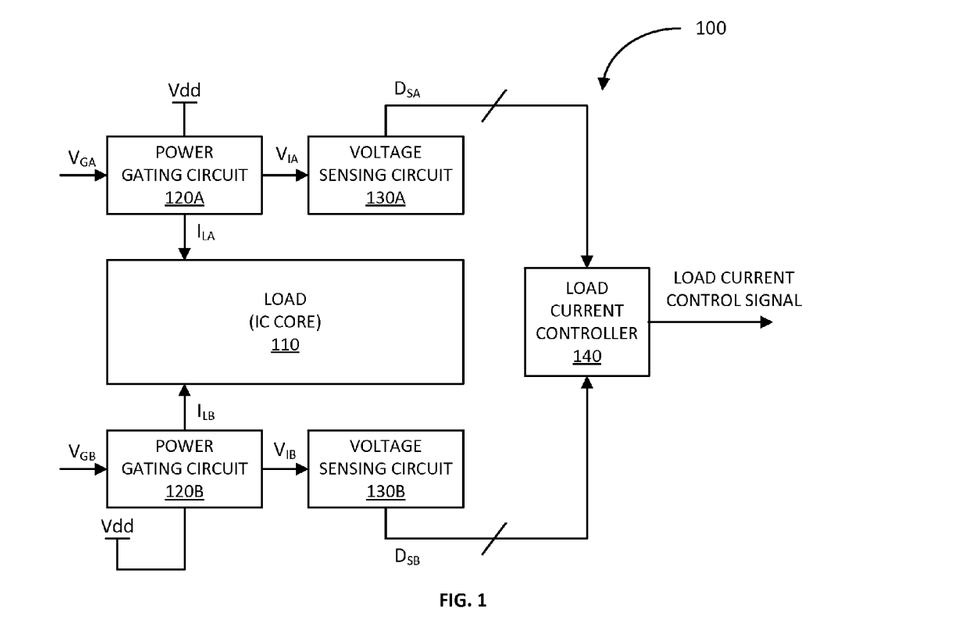
FIG. 1 is a block diagram of an exemplary apparatus for measuring and controlling a load current through one or more power gating circuits in accordance with an aspect of the disclosure.

FIG. 1 is a block diagram of an exemplary apparatus 100 for measuring and controlling a load current in accordance with an aspect of the disclosure. In summary, the apparatus 100 generates a current-related signal related (e.g., substantially proportional) to a current supplied to a load (the "load current") by way of one or more power gating circuits.

A controller receives the current-related signal and performs any number of defined operations based on the current-related signal. For example, the controller may control the load current for IC protection purposes, such as when the temperature of the IC is too high (e.g., above a defined threshold). Alternatively, or in addition to, the controller may control the load current to configure the IC between various power consumption modes (e.g., low power consumption, normal-operation power consumption, etc.). It shall be understood that the controller may control the load current for other purposes.

The controller may control the load current, for example, by increasing or reducing a rail voltage Vdd supplied to the load. Alternatively, or in addition to, the controller may control the load current by enabling or disabling one or more power gating circuits supplying current to the load. Alternatively, or in addition to, the controller may control the load current by increasing or reducing a rate or frequency of a clock signal supplied to the load. It shall be understood that the controller may control the load current in other manners.

With reference to FIG. 1, the apparatus 100 comprises a load 110, such as one or more of an integrated circuit (IC). The apparatus 100 further comprises one or more power gating circuits, such as power gating circuits 120A and 120B. Additionally, the apparatus 100 comprises one or more voltage sensing circuits, such as voltage sensing circuits 130A and 130B. Further, the apparatus 100 comprises a load current controller 140.

Each of the power gating circuits 120A and 120B is coupled between a voltage rail Vdd and the load 110. In response to respective gating voltages $V_{GA}$ and $V_{GB}$, the power gating circuits 120A and 120B allow or do not allow load currents $I_{LA}$ and $I_{LB}$ to flow from the voltage rail Vdd to the load 110. For instance, each of the power gating circuits 120A and 120B may be formed of a plurality of field effect transistors (FETs), such as p-channel metal oxide semiconductor (PMOS) FETs ("PMOS devices"), coupled in parallel between the voltage rail Vdd and the load 110. The gating voltages $V_{GA}$ and $V_{GB}$ are applied to the gates of the parallel PMOS devices of the power gating circuits 120A and 120B, respectively.

When the gate voltages $V_{GA}$ and $V_{GB}$ are selected to be low (e.g., at ground potential), the PMOS devices of power gating circuits 120A and 120B are turned on to allow load currents $I_{LA}$ and $I_{LB}$ to flow from the voltage rail Vdd to the load 110. When the gate voltages $V_{GA}$ and $V_{GB}$ are selected to be high (e.g., at Vdd), the PMOS devices of power gating circuits 120A and 120B are turned off to prevent load currents $I_{LA}$ and $I_{LB}$ from flowing to the load 110. Although, in this example, the power gating circuits 120A and 120B employ PMOS devices, it shall be understood that the circuits 120A and 120B may employ n-channel metal oxide semiconductor (NMOS) devices. Further, although in this example, the apparatus 100 comprises two power gating circuits 120A and 120B, it shall be understood that the apparatus 100 may comprise any number of power gating circuits.

The voltage sensing circuits 130A and 130B are coupled to the power gating circuits 120A and 120B for the purpose of receiving input voltages $V_{IA}$ and $V_{IB}$ related to the load currents $I_{LA}$ and $I_{LB}$ supplied to the load 110, respectively. The voltage sensing circuits 130A and 130B, in turn, generate current-related digital signals $D_{SA}$ and $D_{SB}$ indicative of the load currents $I_{LA}$ and $I_{LB}$, respectively. As discussed in more detail further herein, the voltage sensing circuits 130A and 130B generate the current-related signals $D_{SA}$ and $D_{SB}$ by amplifying the input voltage $V_{IA}$ and $V_{IB}$ and digitizing the amplified voltages, respectively.

The controller 140 receives the current-related signals $D_{SA}$ and $D_{SB}$ and generates a load current control signal based on the current-related signals $D_{SA}$ and $D_{SB}$. The controller 140 generates the control signal for controlling either or both of the load currents $I_{LA}$ and $I_{LB}$ for any number of purposes. For instances, as previously discussed, the controller 140 may generate the control signal for protecting the IC 110 from excessive temperature, for setting a power consumption mode of the IC, and for other purposes. Additionally, as previously discussed, the controller 140 may generate the control signal to control the rail voltage Vdd, to enable or disable any of the power gating circuits 120A and 120B via gating signals $V_{GA}$ and $V_{GB}$, or to control a rate or frequency of a clock signal (not shown) supplied to the IC 110.

Figure 2:
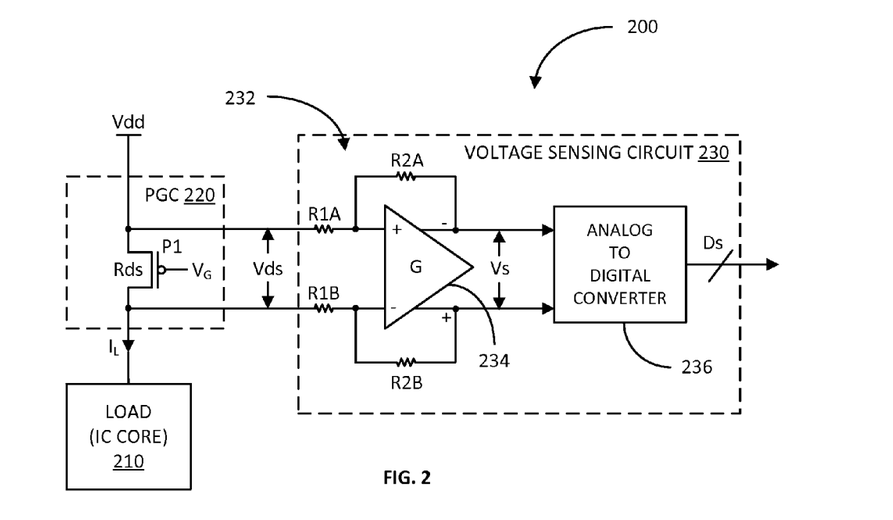
FIG. 2 is a schematic diagram of an exemplary apparatus for generating a signal related to a load current in accordance with another aspect of the disclosure.

FIG. 2 is a schematic diagram of an exemplary apparatus 200 for generating a signal related to a load current in accordance with another aspect of the disclosure. The apparatus 200 includes a more detailed exemplary implementation of power gating circuit 120A or 120B and voltage sensing circuit 130A or 130B, respectively.

More specifically, the apparatus 200 comprises a power gating circuit (PGC) 220 coupled between a voltage rail Vdd and a load 210, such as an IC core. In this example, the power gating circuit 220 comprises a PMOS FET or device P1 comprising a source coupled to the voltage rail Vdd, a gate configured to receive a gating voltage $V_G$, and a drain coupled to the load 210. As previously discussed, when the gating voltage $V_G$ is selected to be low (e.g., ground potential), the PMOS device P1 is turned on to allow a load current $I_L$ to flow from the voltage rail Vdd to the load 210. When the gating voltage $V_G$ is selected to be high (e.g., Vdd), the PMOS device P1 is turned off to prevent the load current $I_L$ from flowing to the load 210. As previously discussed, in most implementations, the power gating circuit 220 comprises a plurality (e.g., tens or hundreds) of PMOS devices coupled in parallel to supply the needed load current for the load 210.

The apparatus 200 further comprises a voltage sensing circuit 230 configured to receive the voltage across the source and drain of the PMOS device P1 (referred to herein as the drain-to-source voltage (Vds)) and generate a current-related digital signal $D_S$ based on Vds. In particular, the voltage sensing circuit 230 comprises a differential amplifier 232 and an analog-to-digital converter (ADC) 236. The differential amplifier 232 comprises an operational amplifier 234 including positive (+) and negative (−) inputs and positive and negative outputs. The differential amplifier 232 further comprises a first feedback resistor R2A coupled between the negative output and the positive input of the operational amplifier 234, and a second feedback resistor R2B coupled between the positive output and the negative input of the operational amplifier 234. Additionally, the differential amplifier 232 comprises a first input resistor R1A coupled between the source of the PMOS device P1 and the positive input of the operational amplifier 234, and a second input resistor R1B coupled between the drain of the PMOS device P1 and the negative input of the operational amplifier 234.

For generating a voltage related to the load current $I_L$, the differential amplifier 232 is configured to generate a current-related voltage Vs across its positive and negative outputs by applying a fixed gain G to the drain-to-source voltage Vds applied to the positive and negative inputs of the operational amplifier 234 by way of input resistors R1A and R1B, respectively. The differential amplifier 232 generates the current-related voltage Vs in accordance with the following equation:

$$Vs = G \times Vds \quad \text{Eq. 1}$$

The gain G of the differential amplifier 232 is given by the following equation:

$$G = \frac{R2}{R1} \quad \text{Eq. 2}$$

where R1 is the resistance of each of the first and second input resistors R1A and R1B (the resistance R1 being substantially the same for both), and R2 is the resistance of each of the first and second feedback resistors R2A and R2B (the resistance R1 being substantially the same for both). Thus, by combining equations 1 and 2, the current-related voltage Vs may be represented by the following equation:

$$Vs = \frac{R2}{R1} \times Vds \quad \text{Eq. 3}$$

The drain-to-source voltage Vds of the PMOS device P1 may be represented by the following equation:

$$Vds = I_L \times Rds \quad \text{Eq. 4}$$

where $I_L$ is the load current through the PMOS device P1 and Rds is the drain-to-source resistance of the PMOS device P1. By combining equations 3 and 4, the current-related voltage Vs may be represented by the following equation:

$$Vs = \frac{R2}{R1} \times I_L \times Rds \quad \text{Eq. 5}$$

Thus, as indicated by equation 5, the current-related voltage Vs is related to the load current $I_L$. Assuming the parameters R2/R1 and Rds remain constant, the current-related voltage Vs is proportional to the load current $I_L$; and thus, the current-related voltage Vs provides an indication of the load current $I_L$. The ADC 236 digitizes the current-related voltage Vs to generate a current-related digital signal Ds for use by a load current controller, as previously discussed.

One issue with the voltage sensing circuit 230 is that the drain-to-source resistance Rds of the PMOS device P1 varies with temperature and the gate-to-source voltage Vgs of the PMOS device P1. The gate-to-source voltage Vgs of the PMOS device P1 may vary due to intended variation of the rail voltage Vdd. For instance, the rail voltage Vdd may be intentionally varied for different applications, such as configuring the load 210 between low, normal, or high (boost) power consumption modes. Because the Rds varies with temperature and Vgs, the current-related voltage Vs is no longer proportional to the load current $I_L$; and thus, the current-related voltage Vs does not provide an accurate indication of the load current $I_L$. This is further illustrated with reference to a graph depicted in FIG. 3.

Figure 3:
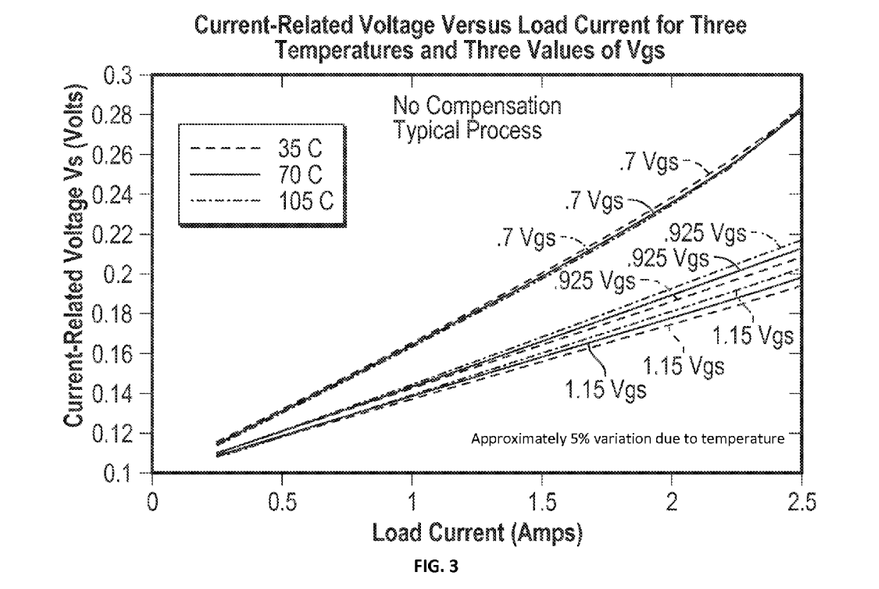
FIG. 3 is a graph of an exemplary current-related voltage versus load current response associated with the apparatus shown in FIG. 2 in accordance with another aspect of the disclosure.

FIG. 3 is a graph of an exemplary current-related voltage Vs versus load current $I_L$ response associated with the apparatus 200 in accordance with another aspect of the disclosure. The x- or horizontal axis represents the load current $I_L$ and the y- or vertical axis represents the current-related voltage Vs. In this example, the Vs versus $I_L$ response is illustrated for 3 different temperatures (35, 70, and 105 degrees Celsius (C)) and 3 different gate-to-source voltages Vgs (0.7, 0.925, and 1.15 Volts (V)) of the power gating PMOS device P1.

As previously discussed, for the current-related voltage Vs to provide an accurate indication of the load current $I_L$, the current-related voltage Vs should vary substantially linear with the load current $I_L$. Thus, it would be preferred for the current-related voltage Vs to vary linearly or proportional with the load current $I_L$, even with variation in the temperature and Vgs of the PMOS device P1. However, this is not the case for apparatus 200. As shown in FIG. 3, the current-related voltage Vs varies inversely with Vgs in spite of the load current $I_L$ remaining constant. Similarly, the current-related voltage Vs varies in the same direction with temperature for the case where Vgs is 0.925V and 1.15V, and varies inversely with temperature for the case where Vgs is 0.7V, even though the load current $I_L$ remains constant. As previously discussed, this leads to errors in the current measurement performed by apparatus 200.

Figure 4:
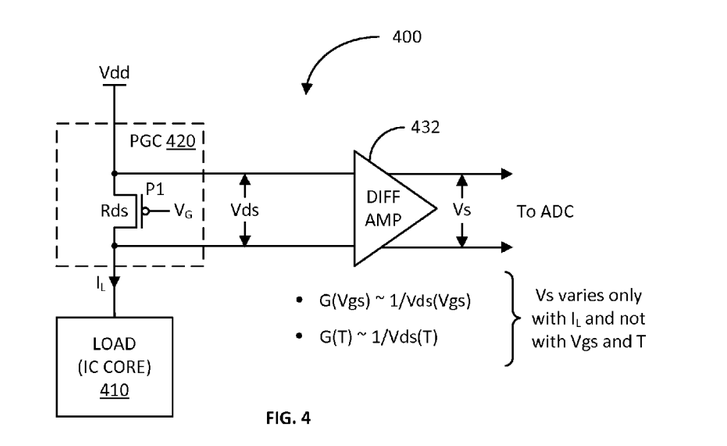
FIG. 4 is a schematic diagram of another exemplary apparatus for measuring a load current in accordance with another aspect of the disclosure.

FIG. 4 is a schematic diagram of another exemplary apparatus 400 for measuring a load current $I_L$ in accordance with another aspect of the disclosure. The apparatus 400 comprises a power gating circuit (PGC) 420 coupled between a voltage rail Vdd and a load 410, such as one or more IC cores. In this example, the power gating circuit 420 comprises a PMOS device P1 including a source coupled to the voltage rail Vdd, a drain coupled to the load 410, and a gate configured to receive a gating voltage $V_G$. As in the previous embodiment, the gating voltage $V_G$ is set to a low voltage (e.g., ground potential) to turn on the PMOS device P1 and allow the load current $I_L$ to flow from the voltage rail Vdd to the load 410 by way of the PMOS device P1. The gating voltage $V_G$ is set to a high voltage (e.g., Vdd) to turn off the PMOS device P1 and prevent the load current $I_L$ from flowing to the load 410.

It shall be understood that the power gating circuit 420 may be implemented as a plurality (e.g., tens or hundreds) of PMOS devices coupled in parallel between the voltage rail Vdd and the load 410. Alternatively, the power gating circuit 420 may be implemented as a plurality (e.g., tens or hundreds) of NMOS devices coupled in parallel between the voltage rail Vdd and the load 410.

The apparatus 400 further comprises a differential amplifier 432 including first and second inputs configured to receive a drain-to-source voltage (Vds) of the PMOS device P1, and generate a current-related voltage Vs based on the drain-to-source voltage Vds of the PMOS device P1. In this case, the differential amplifier 432 is configured with a gain G that varies inversely with the drain-to-source voltage Vds of the PMOS device P1 in response to variation in temperature and/or variation in the gate-to-source voltage Vgs of the PMOS device P1. The gain G of the differential amplifier 432 may be represented by the following equations:

$$G(Vgs) \sim \frac{1}{Vds(Vgs)} \quad \text{Eq. 6}$$

$$G(T) \sim \frac{1}{Vds(T)} \quad \text{Eq. 7}$$

Thus, as indicated by equation 6, the gain G as a function of Vgs varies inversely with the Vds as a function of Vgs. Also, as indicated by equation 7, the gain G as a function of temperature varies inversely with the Vds as a function of temperature.

By configuring the gain G to vary in substantially the same amount as Vds over a defined range of temperature or defined range of Vgs, according to equation 1, the current-related voltage Vs may be configured to vary substantially linear with the load current $I_L$ over a defined range for temperature or Vgs. Thus, in such a case, the current-related voltage Vs provides an accurate indication of the load current $I_L$ over the defined ranges for temperature and Vgs. This is illustrated with reference to the graph depicted in FIG. 5.

Figure 5:
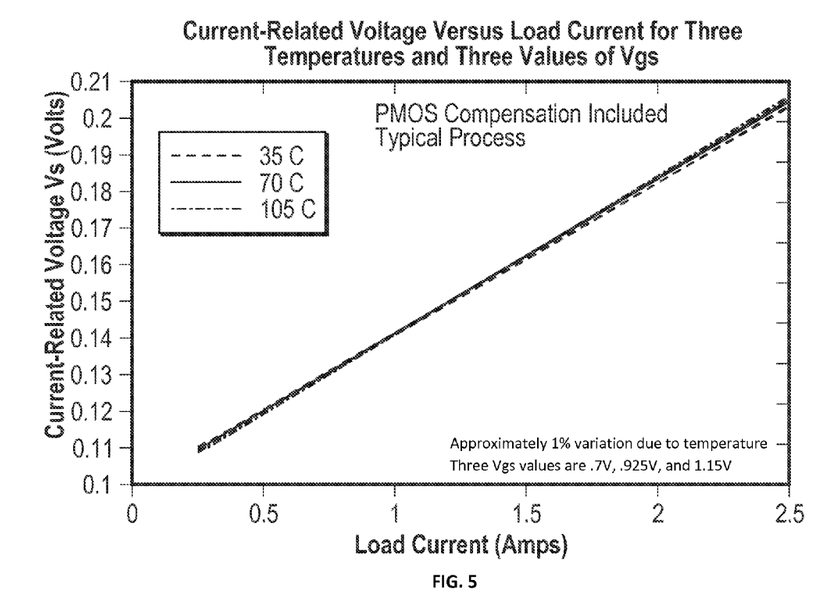
FIG. 5 is another graph of an exemplary current-related voltage versus load current response associated with the apparatus of FIG. 4 in accordance with another aspect of the disclosure.

FIG. 5 is another graph of an exemplary current-related voltage Vs versus load current $I_L$ response associated with the apparatus 400 in accordance with another aspect of the disclosure. The graph parameters (x- and y-axes, dimensions, legend) depicted in FIG. 5 are the same as that of graph depicted in FIG. 3 previously discussed. As shown, the current-related voltage Vs is substantially proportional to (or varies substantially linear with) the load current $I_L$ across a defined temperature range from 35 to 105 degrees Celsius and a defined Vgs range from 0.7 to 1.15 Volts. Thus, the current-related voltage Vs provides an accurate indication of the load current $I_L$ within those defined temperature and Vgs ranges.

Figure 6:
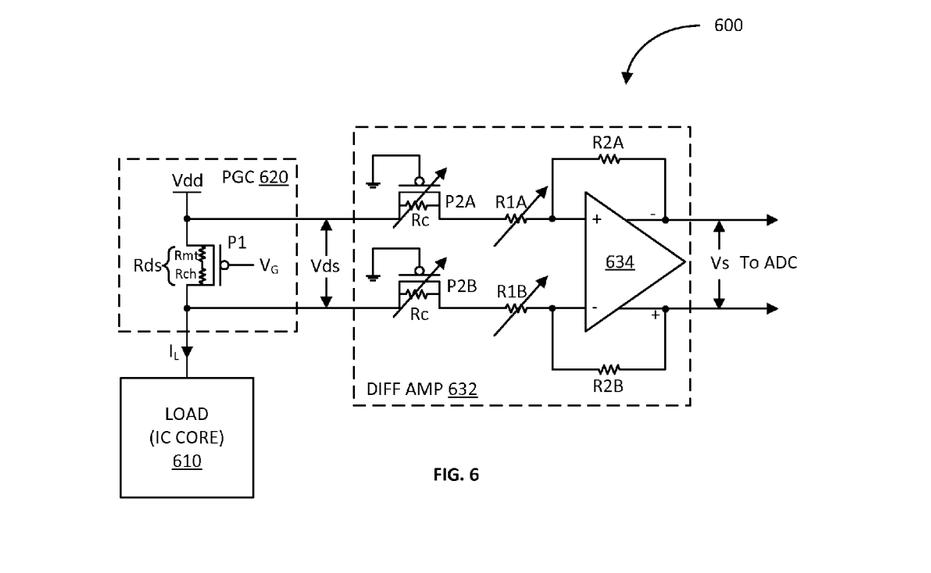
FIG. 6 is a schematic diagram of another exemplary apparatus for measuring a load current in accordance with another aspect of the disclosure.

FIG. 6 is a schematic diagram of another exemplary apparatus 600 for measuring a load current $I_L$ in accordance with another aspect of the disclosure. The apparatus 600 provides a more detailed exemplary implementation of the differential amplifier 432 previously discussed.

In particular, the apparatus 600 comprises a power gating circuit (PGC) 620 coupled between a voltage rail Vdd and a load 610, such as one or more IC cores. In this example, the power gating circuit 620 comprises a PMOS device P1 including a source coupled to the voltage rail Vdd, a drain coupled to the load 610, and a gate configured to receive a gating voltage $V_G$. As in the previous embodiments, the gating voltage $V_G$ is set to a low voltage (e.g., ground potential) to turn on the PMOS device P1 and allow a load current $I_L$ to flow from the voltage rail Vdd to the load 610 by way of the PMOS device P1. The gating voltage $V_G$ is set to a high voltage (e.g., Vdd) to turn off the PMOS device P1 and prevent the load current $I_L$ from flowing to the load 610.

It shall be understood that the power gating circuit 620 may be implemented as a plurality (e.g., tens or hundreds) of PMOS devices coupled in parallel between the voltage rail Vdd and the load 610. Alternatively, the power gating circuit 620 may be implemented as a plurality (e.g., tens or hundreds) of NMOS devices coupled in parallel between the load 610 and another voltage rail (e.g., ground).

The apparatus 600 further comprises a differential amplifier 632 including an operational amplifier 634. A first feedback resistor R2A is coupled between a negative output and a positive input of the operational amplifier 634. A second feedback resistor R2B, which may have substantially the same resistance R2 as the first feedback resistor R2A, is coupled between a positive output and a negative input of the operational amplifier 634. The first and second feedback resistors R2A and R2B may comprise polysilicon resistors.

The differential amplifier 632 further comprises a first input resistive path comprising a first compensating PMOS device P2A coupled in series with a first input resistor R1A. The first input resistive path is coupled between the source of the power gating PMOS P1 and the positive input of the operational amplifier 634. More specifically, the source of the first compensating PMOS device P2A is coupled to the source of the power gating PMOS P1, the drain of the first compensating PMOS device P2A is coupled to a first end of the first resistor R1A, and the gate of the first compensating PMOS device P2A is coupled to ground potential. A second end of the first input resistor R1A is coupled to the positive input of the operational amplifier 634. The first input resistor R1A may be variable, as shown.

Further, although in this example, the first compensating PMOS device P2A is situated between the power gating PMOS P1 and the first input resistor R1A, it shall be understood that the first input resistor R1A may be situated between the power gating PMOS P1 and the first compensating PMOS device P2A. That is, a first end of the first input resistor R1A may be coupled to the source of the power gating PMOS P1, a second end of the first input resistor R1A may be coupled to the source of the first compensating PMOS P2A, and a drain of the first compensating PMOS P2A may be coupled to the input (e.g., positive) of the operational amplifier 634. In such configuration, the gate of the first compensating PMOS P2A may be coupled to ground potential.

The differential amplifier 632 further comprises a second input resistive path comprising a second compensating PMOS device P2B coupled in series with a second input resistor R1B. The second input resistive path is coupled between the drain of the power gating PMOS P1 and the negative input of the operational amplifier 634. More specifically, the source of the second compensating PMOS device P2B is coupled to the drain of the power gating PMOS P1, the drain of the second compensating PMOS device P2B is coupled to a first end of the second resistor R1B, and the gate of the second compensating PMOS device P2B is coupled to ground potential. A second end of the second input resistor R1B is coupled to the negative input of the operational amplifier 634. The second input resistor R1B may also be variable, as shown.

Further, although in this example, the second compensating PMOS device P2B is situated between the power gating PMOS P1 and the second input resistor R1B, it shall be understood that the second input resistor R1B may be situated between the power gating PMOS P1 and the second compensating PMOS device P2B. That is, a first end of the second input resistor R1B may be coupled to the drain of the power gating PMOS P1, a second end of the second input resistor R1B may be coupled to the source of the second compensating PMOS P2B, and a drain of the second compensating PMOS P2B may be coupled to the input (e.g., negative) of the operational amplifier 634. In such configuration, the gate of the second compensating PMOS P2B may be coupled to ground potential.

The first and second input resistors R1A and R1B may comprise polysilicon resistors, and may each be configured to have substantially the same resistance R1. Additionally, it shall be understood that the operational amplifier 634 may be flipped such that the first resistive path is coupled to the negative input and the second resistive path is coupled to the positive input of the operational amplifier. Further, as discussed herein, the first and second compensating PMOS devices P2A and P2B may be configured to have a variable drain-to-source resistance or compensating resistance Rc, as referred to herein.

Using equation 3 previously discussed, a current-related voltage Vs generated by the differential amplifier 632 may be represented by the following equation:

$$Vs = \frac{R2}{(Rc+R1)} \times Vds = \frac{R2}{(Rc+R1)} \times I_L \times Rds \quad \text{Eq. 8}$$

wherein Rc is the resistance of each of the first and second compensating PMOS devices P2A and P2B, R1 is the resistance of each of the first and second input resistors R1A and R1B, and R2 is the resistance of each of the feedback resistors R2A and R2B. In order to configure the current-related voltage Vs to vary substantially linear with the load current $I_L$ over a defined temperature or Vgs range, the variation in resistance Rc+R1 should be substantially the same as the variation in the drain-to-source resistance Rds of the power gating PMOS device P1 over the defined temperature and Vgs ranges.

Considering first the compensation of the current-related voltage Vs due to variation in Vgs, the Rds of the power gating PMOS device P1 may be modeled as a channel resistance Rch in series with a metal contact resistance Rmt. The channel resistance Rch varies as a function of the Vgs of the power gating PMOS device P1. The first and second compensating PMOS devices P2A and P2B are respectively biased to have substantially the same and similar Vgs as the power gating PMOS device P1 when the power gating PMOS device P1 is turned on.

More specifically, when the power gating PMOS device P1 is turned on, the gating voltage $V_G$ is set to ground potential. The source of the power gating PMOS device P1 is at Vdd. Thus, the Vgs of the power gating PMOS device P1 is at substantially Vdd.

The gate of the first compensating PMOS device P2A is connected to ground potential. The source of the first compensating PMOS device P2A is at Vdd. Thus, the Vgs of the first compensating PMOS device P2A is also substantially at Vdd, the same as the Vgs of the power gating PMOS device P1 when turned on.

Similarly, the gate of the second compensating PMOS device P2B is also connected to ground potential. The source of the second compensating PMOS device P2B is coupled to the drain of the power gating PMOS device P1. Since the power gating PMOS device P1 is configured to have a very low Rds to minimize IR losses through the device, the voltage at the drain of the power gating PMOS device P1 is just slightly lower than Vdd. Thus, the Vgs of the second compensating PMOS device P2B is slightly lower than Vdd.

Thus, because the power gating PMOS device P1 and the first and second compensating PMOS devices P2A and P2B are biased respectively with the same and similar Vgs, the channel resistance Rc of the first and second compensating PMOS devices P2A and P2B and the channel resistance Rch of the power PMOS device P1 vary in substantially the same manner as Vgs varies over a defined Vgs range. Thus, since Rds is in the numerator and Rc is in the denominator in equation 8, the current-related voltage Vs is compensated for variation in Vgs by proper configuration of the resistance Rc of the first and second compensating PMOS devices P2A and P2B. As discussed further herein, the first and second compensating PMOS devices P2A and P2B are configured to have variable resistances Rc for optimizing the compensation, e.g., substantially minimizing the variation (or limiting the variation to a specified maximum) in the current-related voltage Vs in response to variation in Vgs over a defined range for Vgs.

Considering next the compensation of the current-related voltage Vs due to variation in temperature, as previously discussed, the drain-to-source resistance Rds of the power gating PMOS device P1 may be modeled as a channel resistance Rch in series with a metal contact resistance Rmt. The first and second resistive paths have a similar configuration: a channel resistance Rc due to the first and second compensating PMOS devices P2A and P2B and the resistance of the polysilicon resistors R1A and R1B. Thus, by proper setting of the resistances Rc and R1, the effective temperature coefficient of Rc+R1 may be made substantially the same as the effective temperature coefficient of Rds (Rch+Rmt) over a defined temperature range. The selection may be achieved empirically and/or by modelling to substantially minimize the variation (or limit the variation to a specified maximum) in the current-related voltage Vs in response to variation in temperature over a defined temperature range.

In summary, by properly configuring the variable resistance Rc of the first and second compensating PMOS devices P2A and P2B and the resistance R1 of the polysilicon resistors R1A and R1B, the current-related voltage Vs may be configured to vary substantially linear with the load current $I_L$ over a defined temperature or Vgs range. Further, the selection of the resistance R1 of each of the polysilicon resistors R1A and R1B, along with the resistance R2 of each of the polysilicon feedback resistors R2A and R2B, may take into account a desired gain G for the differential amplifier 632 to set the current-related voltage Vs within a desired voltage range suitable for digitizing by an analog-to-digital converter, as previously discussed.

Figure 7:
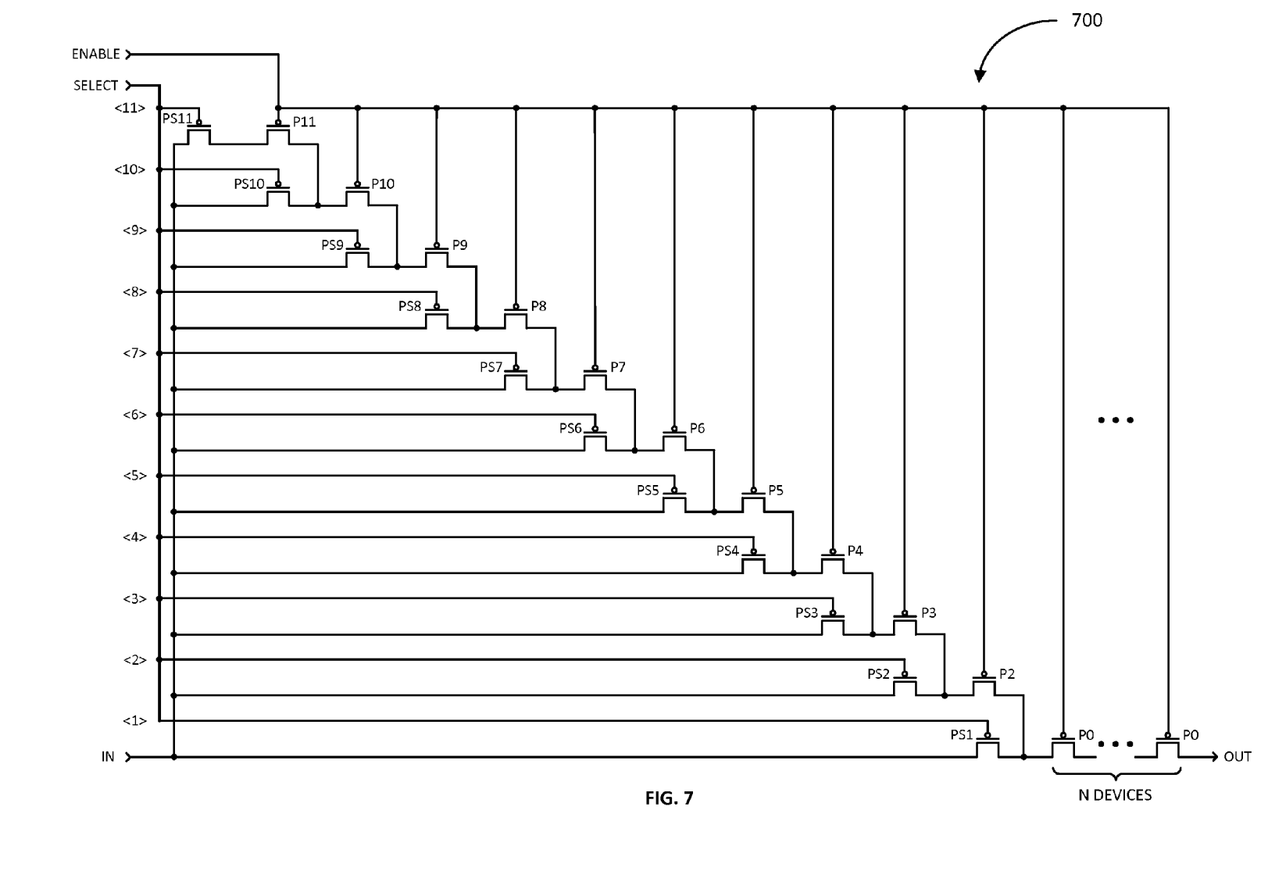
FIG. 7 is a schematic diagram of an exemplary variable compensating PMOS circuit in accordance with another aspect of the disclosure.

FIG. 7 is a schematic diagram of an exemplary variable compensating PMOS circuit 700 in accordance with another aspect of the disclosure. The variable compensating PMOS circuit 700 may be an exemplary implementation of either or both the first and second compensating PMOS devices P2A and P2B previously discussed.

In particular, the variable PMOS circuit 700 comprises an input (IN) that may be coupled to the source or drain of the power gating PMOS device P1, as per the first or second compensating PMOS device P2A or P2B previously discussed. The variable PMOS circuit 700 also comprises an output (OUT) that may be coupled to the corresponding input resistor R1A or R1B, as per the first or second compensating PMOS device P2A or P2B previously discussed.

The variable PMOS circuit 700 includes an input for receiving a SELECT signal for selecting the number of devices connected in series between the input and output for setting the desired resistance for the circuit 700. In this example, the variable PMOS circuit 700 provides a selection from among 11 different configurations of devices connected in series between the input and output of the circuit 700. Through the use of the SELECT signal, only one of the 11 available configurations is enabled at a time. It shall be understood that the variable PMOS circuit 700 may be configured to provide a selection of any number of devices connected in series between the input and output of the circuit 700. The variable PMOS circuit 700 further includes an input for receiving an ENABLE signal for selectively enabling the circuit by turning on and off PMOS devices P0-P11. Turning off devices P0-P11 configures the variable PMOS circuit 700 to effectuate an open or very high resistance between the input and output of the circuit 700.

The following table indicates the various states of the SELECT signal, the corresponding number of PMOS devices connected in series between the input and output of the variable PMOS circuit 700, and the identification of the corresponding PMOS devices:

| SELECT SIGNAL | NO. OF DEVICES | IDENTIFICATION OF DEVICES |
|---|---|---|
| <1> | N + 1 | PS1 + N PS0s |
| <2> | N + 2 | PS2 + P2 + N PS0s |
| <3> | N + 3 | PS3 + P3 + P2 + N PS0s |
| <4> | N + 4 | PS4 + P4 + P3 + P2 + N PS0s |
| <5> | N + 5 | PS5 + P5 + P4 + P3 + P2 + N PS0s |
| <6> | N + 6 | PS6 + P6 + P5 + P4 + P3 + P2 + N PS0s |
| <7> | N + 7 | PS7 + P7 + P6 + P5 + P4 + P3 + P2 + N PS0s |
| <8> | N + 8 | PS8 + P8 + P7 + P6 + P5 + P4 + P3 + P2 + N PS0s |
| <9> | N + 9 | PS9 + P9 + P8 + P7 + P6 + P5 + P4 + P3 + P2 + N PS0s |
| <10> | N + 10 | PS10 + P10 + P9 + P8 + P7 + P6 + P5 + P4 + P3 + P2 + N PS0s |
| <11> | N + 11 | PS11 + P11 + P10 + P9 + P8 + P7 + P6 + P5 + P4 + P3 + P2 + N PS0s |

In this example, the fixed N PMOS devices P0 is to configure the variable PMOS circuit 700 with a minimum resistance between the input and output. The remaining selectable PMOS devices PS1-PS11 and P2-P11 is for providing fine adjustment of the resistance above the minimum resistance. The minimum resistance may be selected based on the worst case minimum resistance required for the first and second compensating PMOS devices P2A and P2B. It shall be understood that the variable PMOS circuit 700 may be implemented in other manners to effectuate a variable resistance for the first and second compensating PMOS devices P2A and P2B.

Figure 8:
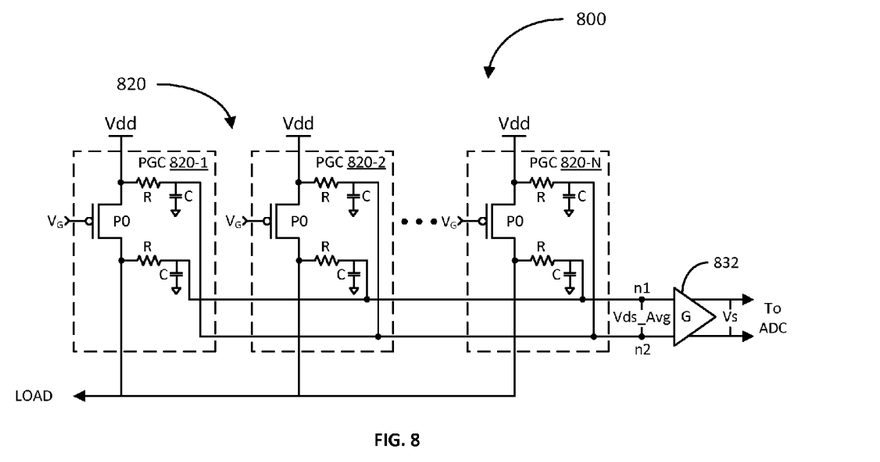
FIG. 8 is a schematic diagram of an exemplary apparatus for measuring a load current in accordance with another aspect of the disclosure.

FIG. 8 is a schematic diagram of an exemplary apparatus 800 for measuring a load current in accordance with another aspect of the disclosure. In this example, the apparatus 800 comprises a power gating circuit 820 including a plurality of power gating sub-circuits (PGC) 820-1 to 820-N coupled in parallel between a voltage rail Vdd and a load. Each of the power gating sub-circuits 820-1 to 820-N comprises a power gating PMOS device P0 including a source coupled to the voltage rail, a drain coupled to the load, and a gate configured to receive a gating signal $V_G$. As previously discussed, an NMOS device may replace the PMOS device P0.

Each of the power gating sub-circuits 820-1 to 820-N further comprises a pair of resistors R respectively coupled between the source and drain of the power gating PMOS device P0 and first and second input nodes of a differential amplifier 832. Additionally, each of the power gating sub-circuits 820-1 to 820-N may be associated with parasitic capacitance C formed respectively across the first and second input nodes of the differential amplifier 832 and ground.

An input differential voltage Vds_Avg formed across the input and output of the differential amplifier 832 may be related to the plurality of individual drain-to-source voltages (Vds) of the power gating PMOS devices P0, respectively. For example, assuming all of the resistors R and parasitic capacitors C have substantially the same resistance and capacitance, the input differential voltage Vds_Avg may be substantially an average of the individual drain-to-source voltages (Vds) of the power gating PMOS devices P0.

The differential amplifier 832 may be configured similar to that of either differential amplifier 432 or 632. For instance, the differential amplifier 832 may be configured to include a gain G that varies inversely with the input differential voltage Vds_Avg in response to variation in temperature or gate-to-source voltages Vgs of the power gating PMOS devices P0 when the devices are turned on for supplying a load current to the load. Further, the degree of variation of the gain G with temperature and Vgs may be substantially the same degree as the degree of variation of the input differential voltage Vds_Avg with temperature and Vgs, such that a current-related voltage Vs generated at an output of the differential amplifier 832 varies substantially linear with the load current. As previously discussed, the current-related voltage Vs may be digitized by an ADC to generate a current-related digital signal for processing by a load current controller.

Figure 9:
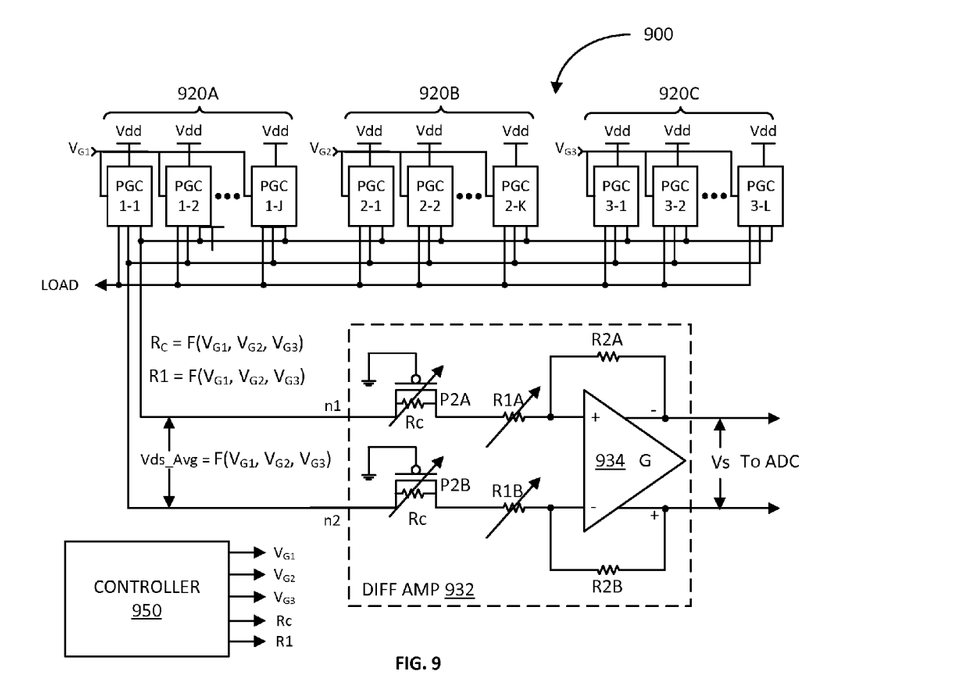
FIG. 9 is a schematic diagram of an exemplary apparatus for measuring a load current in accordance with another aspect of the disclosure.

FIG. 9 is a schematic diagram of an exemplary apparatus 900 for measuring a load current in accordance with another aspect of the disclosure. In this example, the apparatus 900 comprises a plurality of power gating circuits 920A-920C coupled in parallel between a voltage rail Vdd and a load. Although in this example, the apparatus 900 is shown to include three (3) power gating circuits 920A-920C, it shall be understood that the apparatus 900 may include two (2) or more of such power gating circuits.

Each of the power gating circuits 920A-920C include a plurality of power gating sub-circuits. For instance, power gating circuit 920A comprises power gating sub-circuits 1-1 to 1-J coupled between the voltage rail Vdd and the load; power gating circuit 920B comprises power gating sub-circuits 2-1 to 2-K coupled between the voltage rail Vdd and the load; and power gating circuit 920C comprises power gating sub-circuits 3-1 to 3-L coupled between the voltage rail Vdd and the load.

Each of the power gating sub-circuits may be configured substantially the same or similar to any of the power gating sub-circuits 820-1 to 820-N previously discussed. More specifically, each of the power gating sub-circuits 1-1 to 14 of the power gating circuit 920A may comprise a power gating PMOS device including a source coupled to Vdd, a drain coupled to the load, and a gate configured to receive a first gating voltage $V_{G1}$. Similarly, each of the power gating sub-circuits 2-1 to 2-K of the power gating circuit 920B may comprise a power gating PMOS device including a source coupled to Vdd, a drain coupled to the load, and a gate configured to receive a second gating voltage $V_{G2}$. And, each of the power gating sub-circuits 3-1 to 3-L of the power gating circuit 920C may comprise a power gating PMOS device including a source coupled to Vdd, a drain coupled to the load, and a gate configured to receive a third gating voltage $V_{G3}$.

As in each of the power gating sub-circuits 820-1 to 820-N, each of the power gating sub-circuits 1-1 to 1-J, 2-1 to 2-K, and 3-1 to 3-L comprises a pair of resistors coupled between source and drain and first and second input nodes n1 and n2 of a differential amplifier 932. Also, similar to each of the power gating sub-circuits 820-1 to 820-N, each of the power gating sub-circuits 1-1 to 1-J, 2-1 to 2-K, and 3-1 to 3-L is associated with parasitic capacitance formed between the first and second input nodes n1 and n2 and ground.

The differential amplifier 932 may be configured similar to differential amplifier 632 previously discussed. More specifically, the differential amplifier 932 comprises an operational amplifier 934, first and second resistive paths respectively coupled between nodes n1 and n2 and positive and negative inputs of the operational amplifier 934, and feedback resistors R2A and R2B respectively coupled between the negative output and the positive input, and the positive output and the negative input of the operational amplifier 934. The first and second resistive paths comprise first and second compensating PMOS devices P2A and P2B coupled in series with corresponding resistors R1A and R1B, respectively. Similar to apparatus 600, the positions of the first and second compensating PMOS devices P2A and P2B may be swapped with the positions of the first and second input resistors R1A and R1B, respectively.

The power gating circuits 920A-920C alone or in combination produce an input differential voltage Vds_Avg across nodes n1 and n2 at the inputs of the differential amplifier 932. For instance, the gating voltages $V_{G1}$, $V_{G2}$, and $V_{G3}$ may be independently controlled to selectively turn on power gating circuits 920A, 920B, and 920C for supplying load current to the load, respectively. The differential voltage Vds_Avg developed across the input nodes n1 and n2 of the differential amplifier 932 may depend on which of the power gating circuits 920A to 920C are turned on. In other words, the differential voltage Vds_Avg is a function of the states of the gating voltages $V_{G1}$, $V_{G2}$, and $V_{G3}$.

More specifically, the differential voltage Vds_Avg may be related to only drain-to-source voltages Vds of the power gating devices of power gating sub-circuits 1-1 to 1-J if gating voltage $V_{G1}$ is set to turn on sub-circuits 1-1 to 1-J, and gating voltages $V_{G2}$ and $V_{G3}$ are set to turn off sub-circuits 2-1 to 2-K and 3-1 to 3-L. For example, in such a case, the differential voltage Vds_Avg may be configured to be substantially an average of the Vds of power gating devices in sub-circuits 1-1 to 1-J.

Similarly, the differential voltage Vds_Avg may be related (e.g., average) to only drain-to-source voltages Vds of the power gating devices of power gating sub-circuits 2-1 to 1-K if gating voltage $V_{G2}$ is set to turn on sub-circuits 2-1 to 2-K, and gating voltages $V_{G1}$ and $V_{G3}$ are set to turn off sub-circuits 1-1 to 1-J and 3-1 to 3-L. In a like manner, the differential voltage Vds_Avg may be related (e.g., average) to only drain-to-source voltages Vds of the power gating devices of power gating sub-circuits 3-1 to 3-L if gating voltage $V_{G3}$ is set to turn on sub-circuits 3-1 to 3-L, and gating voltages $V_{G1}$ and $V_{G2}$ are set to turn off sub-circuits 1-1 to 1-J and 2-1 to 2-K.

Additionally, the differential voltage Vds_Avg may be related to only drain-to-source voltages Vds of the power gating devices of power gating sub-circuits 1-1 to 1-J and 2-1 to 2-K if gating voltages $V_{G1}$ and $V_{G2}$ are set to turn on sub-circuits 1-1 to 1-J and 2-1 to 2-K, and gating voltage $V_{G3}$ is set to turn off sub-circuits 3-1 to 3-L. For example, in such a case, the differential voltage Vds_Avg may be configured to be substantially an average of the Vds of power gating devices in sub-circuits 1-1 to 1-J and 2-1 to 2-K.

Similarly, the differential voltage Vds_Avg may be related (e.g., average) to only drain-to-source voltages Vds of the power gating devices of power gating sub-circuits 1-1 to 1-J and 3-1 to 3-M if gating voltages $V_{G1}$ and $V_{G3}$ are set to turn on sub-circuits 1-1 to 1-J and 3-1 to 3-L, and gating voltage $V_{G2}$ is set to turn off sub-circuits 2-1 to 2-K. In a like manner, the differential voltage Vds_Avg may be related (e.g., average) to only drain-to-source voltages Vds of the power gating devices of power gating sub-circuits 2-1 to 2-K and 3-1 to 3-L if gating voltages $V_{G2}$ and $V_{G3}$ are set to turn on sub-circuits 2-1 to 2-K and 3-1 to 3-L, and gating voltage $V_{G1}$ is set to turn off sub-circuits 1-1 to 1-J.

The differential voltage Vds_Avg may be related to the drain-to-source voltages Vds of the power gating devices of all the power gating sub-circuits 1-1 to 1-J, 2-1 to 2-K, and 3-1 to 3-L if gating voltages $V_{G1}$, $V_{G2}$ and $V_{G3}$ are set to turn on sub-circuits 1-1 to 1-J, 2-1 to 2-K, and 3-1 to 3-L. For example, in such a case, the differential voltage Vds_Avg may be configured to be substantially an average of the Vds of power gating devices in sub-circuits 1-1 to 1-J, 2-1 to 2-K, and 3-1 to 3-L.

The states of the gating voltages $V_{G1}$, $V_{G2}$, and $V_{G3}$ may be selected based on a demand for load current required for the load. For example, the number of devices J in power gating circuit 920A may be less than the number of devices K in power gating circuit 920B which, in turn, may be less than the number of devices L in power gating circuit 920C. The number of devices may be related to an amount of load current supplied to the load.

For example, if the load requires a minimum amount of current depending on its mode of operation, the gating voltage $V_{G1}$ may be set to turn on power gating circuit 920A and gating voltages $V_{G2}$ and $V_{G3}$ may be set to turn off power gating circuits 920B and 920C. If the load requires a maximum amount of current depending on its mode of operation, the gating voltages $V_{G1}$, $V_{G2}$, and $V_{G3}$ may be set to turn all power gating circuit 920A, 920C, and 920C. In such configuration, the load current may be increased in steps from the minimum to the maximum load current by setting the gating voltages $V_{G1}$, $V_{G2}$, and $V_{G3}$ to the following logic states in the case where PMOS devices are used in the power gating sub-circuits: (101)—turn on only 920B, (110)—turn on only 920C, (001)—turn on only 920A-B, (010)—turn on only 920A and C, and (100)—turn on only 920 B-C.

As previously discussed, the differential amplifier 932 is configured to have a gain G that varies inversely with and in substantially the same amount as the input voltage Vds_Avg in response to variation in temperature and Vgs of the power gating devices of circuits 920A-920C. Again, this is done so that the current-related voltage Vs varies substantially linear with the load current.

Since the input voltage Vds_Avg varies depending on the states of the gating voltages $V_{G1}$, $V_{G2}$, and $V_{G3}$, the controller 950 is configured to change the first and second input resistive paths of the differential amplifier 932 to ensure that the current-related voltage Vs varies substantially linear with the load current. In other words, the controller 950 is configured to vary the resistance Rc of each of the first and second compensating devices P2A and P2B and the resistance R1 of each of the input resistors R1A and R1B as a function of the states of the gating voltages $V_{G1}$, $V_{G2}$, and $V_{G3}$.

As discussed, to effectuate the change in the first and second input resistive paths, the controller 950 is configured to generate selected states for the gating voltages $V_{G1}$, $V_{G2}$, and $V_{G3}$ for controlling the load current, and signals for controlling the resistance Rc of the first and second compensating PMOS devices P2A and P2B and the resistance R1 of resistors R1A and R1B. The resistance of the first and second PMOS devices P2A and P2B may be varied using the variable PMOS circuit 700 previously discussed. The resistance of resistors R1A and R1B, which may be implemented as polysilicon resistors, may be varied using a configurable bank of resistors.

Figure 10:
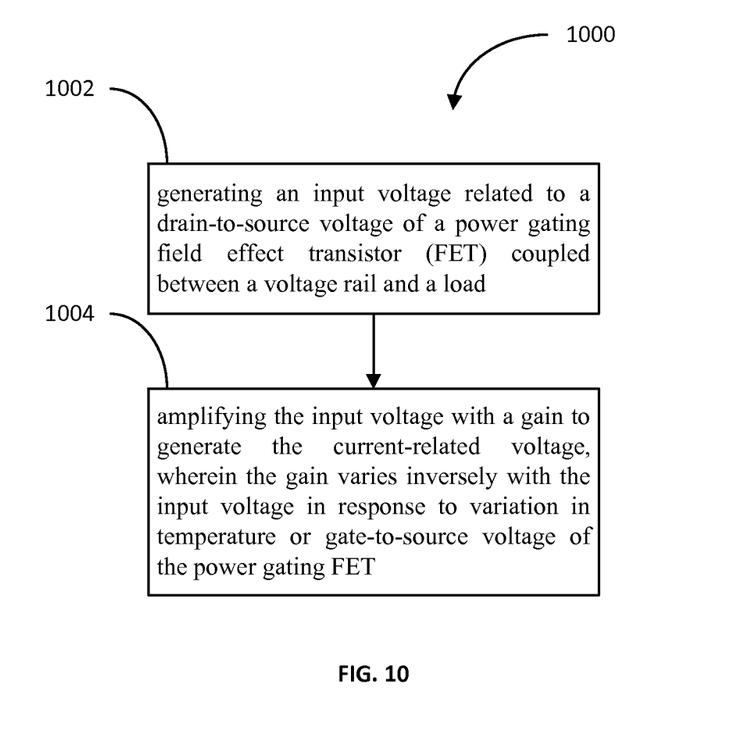
FIG. 10 is a flow diagram of an exemplary method for measuring a load current in accordance with another aspect of the disclosure.

FIG. 10 is a flow diagram of an exemplary method 1000 for measuring a load current in accordance with another aspect of the disclosure. According to the method 1000, an input voltage is generated related to a drain-to-source voltage of a power gating field effect transistor (FET) coupled between a voltage rail and a load (block 1002). Further, according to the method 1000, the input voltage is amplified with a gain to generate the current-related voltage, wherein the gain varies inversely with the input voltage in response to variation in temperature or gate-to-source voltage of the power gating FET (block 1004).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a power gating field effect transistor (FET) comprising a gate, a source, and a drain, wherein the source is coupled to a voltage rail, wherein the drain is coupled to a load, and wherein the gate is configured to receive a gating voltage to selectively turn on the power gating FET to allow a load current to flow between the voltage rail and the load by way of the power gating FET; and
a differential amplifier configured to generate a current-related voltage related to the load current by applying a gain to an input voltage, wherein the input voltage is based on a drain-to-source voltage of the power gating FET, and wherein the gain varies inversely with the input voltage in response to variation in temperature or gate-to-source voltage of the power gating FET, wherein the differential amplifier comprises:
an operational amplifier;
a first compensating PMOS device including a first gate, a first source, and a first drain, wherein the first compensating PMOS device is coupled between the source of the power gating FET and a first input of the operational amplifier, wherein the first gate is configured to receive a first gate voltage substantially the same as the gating voltage that turns on the power gating FET;
a second compensating PMOS device including a second gate, a second source, and a second drain, wherein the second compensating PMOS device is coupled between the drain of the power gating FET and a second input of the operational amplifier, wherein the second gate is configured to receive a second gate voltage substantially the same as the gating voltage that turns on the power gating FET; and
at least one feedback resistor coupled across an output of the operational amplifier and one of the first or second inputs of the operational amplifier, wherein the current-related voltage is generated at the output of the operational amplifier.

2. The apparatus of claim 1, wherein the gain of the differential amplifier is configured such that the current-related voltage varies substantially linear with variation in the load current.

3. The apparatus of claim 1, wherein the differential amplifier further comprises:
a first resistor coupled between the first compensating PMOS device and the first input of the operational amplifier; and
a second resistor coupled between the second compensating PMOS device and the second input of the operational amplifier.

4. The apparatus of claim 3, wherein the differential amplifier generates the current-related voltage Vs substantially in accordance with a following relationship:

$$Vs = I_L \times Rds \times \frac{R2}{R1 + Rc}$$

wherein R1 is a resistance of each of the first and second resistors, R2 is a resistance of the at least one feedback resistor, Rc is a resistance of each of the first and second compensating PMOS devices, Rds is a drain-to-source resistance of the power gating FET, $I_L$ is the load current, and Vs is the current-related voltage.

5. The apparatus of claim 4, wherein the first and second compensating PMOS devices and the first and second resistors are configured such that the sum of resistances R1 and Rc varies with the temperature or the gate-to-source voltage of the power gating FET in substantially the same manner as the drain-to-source resistance Rds varies with the temperature or the gate-to-source voltage of the power gating FET.

6. The apparatus of claim 1, wherein the differential amplifier further comprises:
a first resistor coupled between the source of the power gating FET and the first compensating PMOS device; and
a second resistor coupled between the drain of the power gating FET and the second compensating PMOS device.

7. The apparatus of claim 1, wherein at least one of the first and second compensating PMOS devices each comprises:
a plurality of series-connected PMOS devices; and
a selection circuit configured to couple only a selected subset of the series-connected FETs between the source or drain of the power gating FET and the first or second input of the operational amplifier, respectively.

8. The apparatus of claim 1, wherein the power gating FET comprises a power gating PMOS device, wherein the first and second gates of the first and second compensating PMOS devices are coupled to ground potential, and wherein the gating voltage is at ground potential to turn on the power gating PMOS device.

9. The apparatus of claim 1, further comprising:
a first set of power gating FETs comprising a first set of sources, a first set of drains, and a first set of gates, wherein the first set of sources are coupled to the voltage rail, wherein the first set of drains are coupled to the load, wherein the first set of gates are configured to receive the gating voltage to selectively turn on the first set of power gating FETs to allow the load current to flow between the voltage rail and the load by way of the first set of power gating FETs, wherein the power gating FET is a member of the first set of power gating FETs;

a second set of power gating FETs comprising a second set of sources, a second set of drains, and a second set of gates, wherein the second set of sources are coupled to the voltage rail, wherein the second set of drains are coupled to the load, wherein the second set of gates are configured to receive a second gating voltage to selectively turn on the second set of power gating FETs to allow the load current to flow between the voltage rail and the load by way of the second set of power gating FETs;

wherein the first and second sets of sources are coupled to a first node by way of a first set of respective resistors, wherein the first and second sets of drains are coupled to a second node by way of a second set of respective resistors, and wherein the input voltage is formed across the first and second nodes; and a controller configured to adjust a resistance of each of the first and second compensating PMOS devices and a resistance of each of the first and second resistors based on respective states of the gating voltage and the second gating voltage.

10. The apparatus of claim 1, further comprising one or more other power gating FETs including one or more other gates, one or more other sources, and one or more other drains, wherein the one or more other sources are coupled to the voltage rail, wherein the one or more other drains are coupled to the load, wherein the one or more other gates are configured to receive the gating voltage to turn on the one or more other power gating FETs to allow the load current to flow between the voltage rail and the load by way of the one or more other power gating FETs, wherein the one or more other sources and the source of the power gating FET are coupled to a first node by way of two or more respective resistors, wherein the one or more other drains and the drain of the power gating FET are coupled to a second node by way of two or more other respective resistors, and wherein the input voltage is formed across the first and second nodes.

* * * * *